United States Patent
Lin et al.

(10) Patent No.: US 11,121,691 B2
(45) Date of Patent: Sep. 14, 2021

(54) RESONATOR STRUCTURE ENCAPSULATION

(71) Applicant: Intel Corporation, Santa Clara, CA (US)

(72) Inventors: Kevin Lin, Beaverton, OR (US); Kimin Jun, Portland, OR (US); Edris Mohammed, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 42 days.

(21) Appl. No.: 16/348,830

(22) PCT Filed: Dec. 29, 2016

(86) PCT No.: PCT/US2016/069315
§ 371 (c)(1),
(2) Date: May 9, 2019

(87) PCT Pub. No.: WO2018/125165
PCT Pub. Date: Jul. 5, 2018

(65) Prior Publication Data
US 2019/0267961 A1    Aug. 29, 2019

(51) Int. Cl.
*H03H 3/02* (2006.01)
*H03H 9/17* (2006.01)

(52) U.S. Cl.
CPC ............ *H03H 3/02* (2013.01); *H03H 9/173* (2013.01); *H03H 2003/021* (2013.01)

(58) Field of Classification Search
CPC .... H03H 3/02; H03H 9/173; H03H 2003/021; H03H 9/1014
USPC .................................................. 333/186, 187
See application file for complete search history.

(56) References Cited

U.S. PATENT DOCUMENTS

| | | | |
|---|---|---|---|
| 9,102,517 B2* | 8/2015 | Maling | ............... B81C 1/00333 |
| 2006/0258039 A1 | 11/2006 | Lutz et al. | |
| 2008/0160679 A1 | 7/2008 | Colgan et al. | |
| 2009/0261453 A1 | 10/2009 | Matz et al. | |
| 2012/0190204 A1 | 7/2012 | Graves-Abe et al. | |
| 2013/0126989 A1 | 5/2013 | Lin et al. | |
| 2014/0125431 A1* | 5/2014 | Bhattacharjee | ...... H03H 9/2405 333/186 |

OTHER PUBLICATIONS

International Search Report and Written Opinion for International Patent Application No. PCT/US2016/069315, dated Jul. 11, 2019, 11 pages.
International Search Report and Written Opinion for International Patent Application No. PCT/US2016/069315, dated Sep. 25, 2017, 15 pgs.

* cited by examiner

*Primary Examiner* — Robert J Pascal
*Assistant Examiner* — Jorge L Salazar, Jr.
(74) *Attorney, Agent, or Firm* — Schwabe, Williamson & Wyatt, P.C.

(57) ABSTRACT

The RF filters used in conventional mobile devices often include resonator structures, which often require free-standing air-gap structure to prevent mechanical vibrations of the resonator from being damped by a bulk material. A method for fabricating a resonator structure comprises depositing a non-conformal thin-film to the resonator structure to seal air gap cavities in the resonator structure.

20 Claims, 5 Drawing Sheets

RESONATOR STRUCTURE ENCAPSULATION

CROSS-REFERENCE TO RELATED APPLICATION

This patent application is a U.S. National Phase Application under 35 U.S.C. § 371 of International Application No. PCT/US2016/069315, filed Dec. 29, 2016, entitled "RESONATOR STRUCTURE ENCAPSULATION," which designates the United States of America, the entire disclosure of which is hereby incorporated by reference in its entirety and for all purposes.

FIELD

The present disclosure generally relates to a resonator structure.

BACKGROUND

The development of mobile telecommunications continues towards ever smaller and increasingly complicated handheld units. The development leads to increasing requirements on the miniaturization of the components and structures used in the mobile communication means. This development effects radio frequency (RF) filter structures as well, which despite the increasing miniaturization should be able to withstand considerable power levels, have very steep passband edges, and low losses.

The RF filters used in conventional mobile devices often include resonator structures, which often require free-standing air-gap structures to prevent mechanical vibrations of the resonator from being damped by a bulk material. However, air gap structures are difficult to integrate on silicon integrated circuits (ICs) because of increased silicon processing complexity. Further, the air gap must be hermetically sealed to minimize device performance changes during the operational lifetime of the material.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention.

Figure 1:
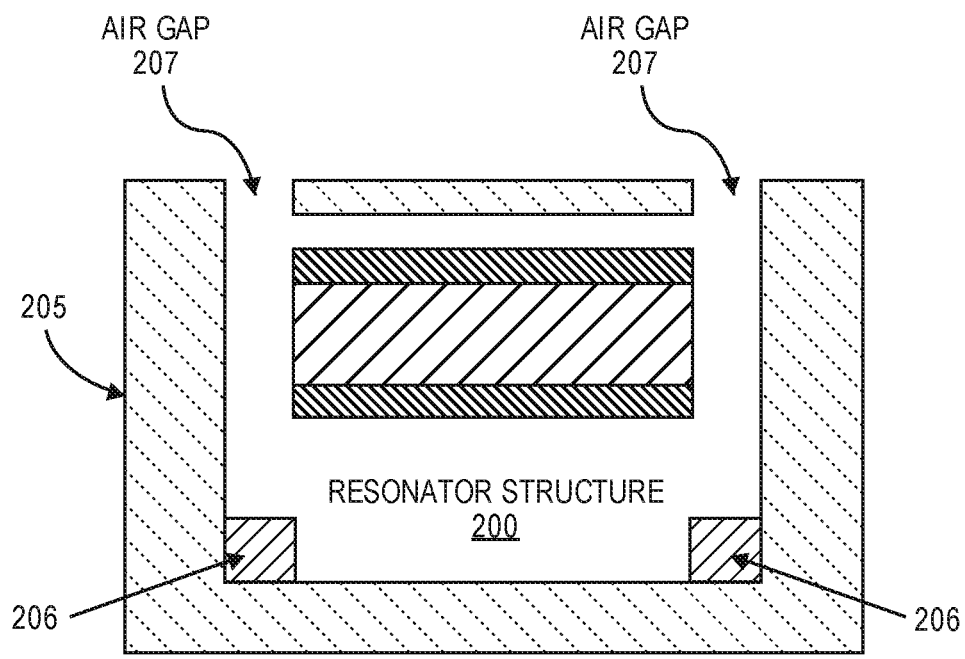
FIG. 1 illustrates one embodiment of a resonator structure.

FIG. 1 illustrates one embodiment of a resonator structure 200. As shown in FIG. 1, resonator structure 200 includes sidewalls 205, deposition layers 206 and air cavities 207 that are implemented to prevent mechanical vibrations of the resonator structure from being damped by a bulk material.

As discussed above, air gap structures are difficult to integrate because of increased processing complexity. According to one embodiment, a fabrication process is disclosed that implements a non-conformal thin-film deposition to hermetically seal the air gap cavities of resonator structure 200.

Figure 2:
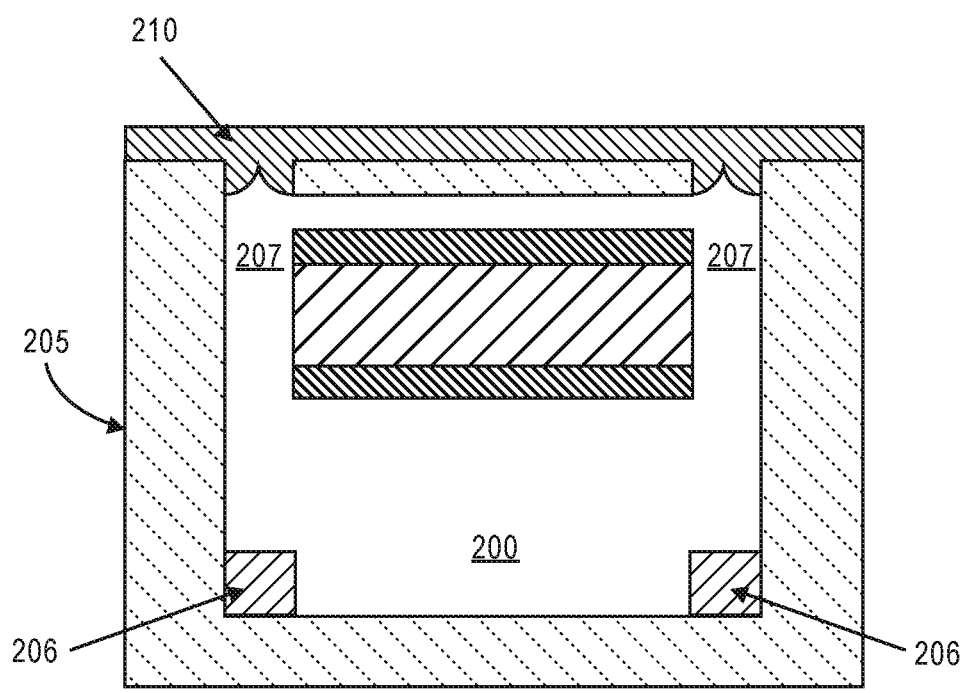
FIG. 2 illustrates a resonator structure according to one embodiment.

FIG. 2 illustrates an embodiment of a resonator structure 200 having a deposition layer 210 covering air gaps 207. In one embodiment, deposition layer 210 is a non-conformal deposition applied via a Chemical Vapor Deposition (CVD) or Physical Vapor Deposition (PVD) type deposition. In such an embodiment, the deposition rate of layer 210 on top of structure 200 is faster than the deposition rate of side-wall 205, resulting in pinching off and sealing of air gap 207 cavities once enough material has been deposited.

Figure 3:
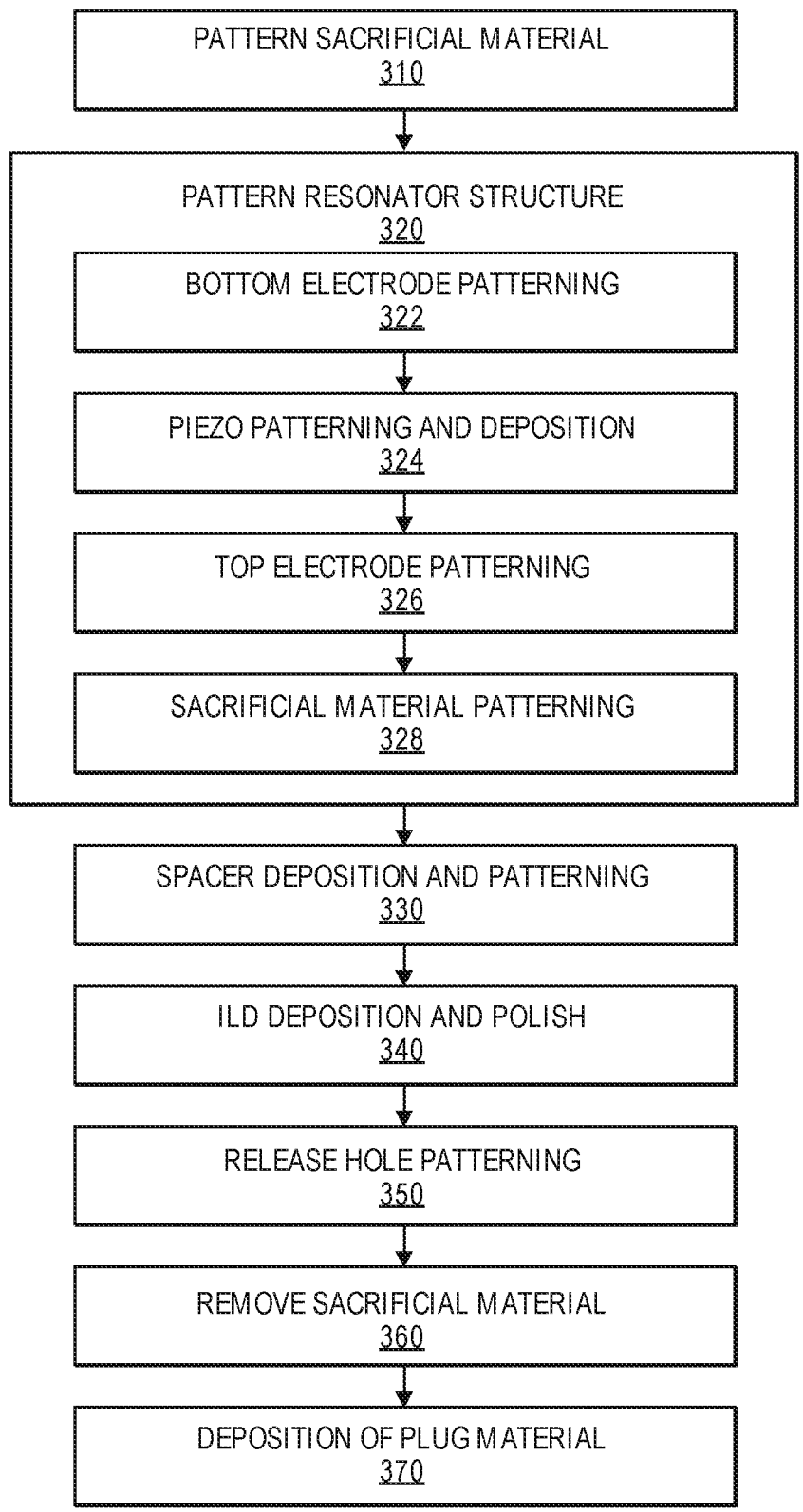
FIG. 3 is a flow diagram illustrating one embodiment of a process for fabricating a resonator structure.
Figure 4A:
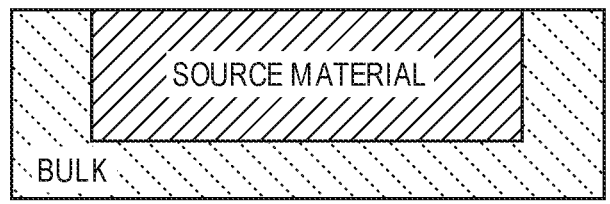
FIGS. 4A-4F illustrate embodiments of a resonator structure during fabrication.

FIG. 3 is a flow diagram illustrating one embodiment of a process for fabricating a resonator structure, such as resonator structure 200. At processing block 310, a sacrificial material is patterned and polished. In one embodiment, the sacrificial material may be comprised of silicon. However in other embodiments the sacrificial material may be comprised of silicon dioxide or titanium nitride (TiN). FIG. 4A illustrates one embodiment of the resonator structure after the sacrificial material is patterned.

Figure 4B:
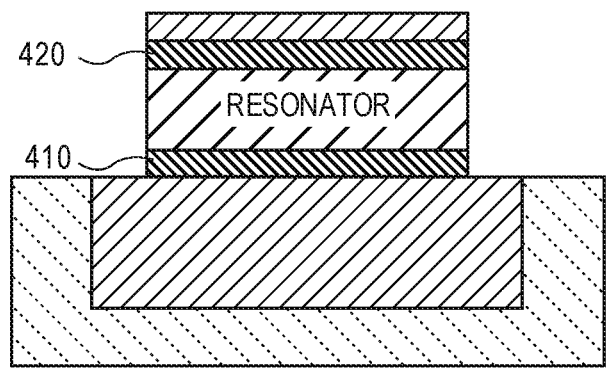

At processing block 320, the resonator structure is patterned. In one embodiment, resonator structure patterning includes patterning a bottom electrode on the sacrificial material (processing block 322), depositing and patterning a piezoelectric material on the bottom electrode (processing block 324), patterning a top electrode on the piezoelectric material (processing block 326) and patterning the top sacrificial material (processing block 328). FIG. 4B illustrates one embodiment of the resonator structure after patterning. As shown in FIG. 4B, the resonator structure includes bottom electrode 410 and top electrode 420. According to one embodiment, the bottom and top electrodes may be comprised one of tantalum (Ta) copper (Cu), molybdenum (Mo), ruthenium (Ru), tungsten (W), titanium (Ti), titanium-nitride (TiN) aluminum (Al) and nickel (Ni).

Figure 4C:
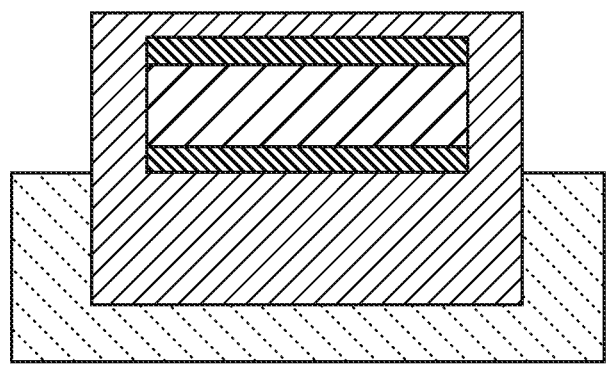
Figure 4D:
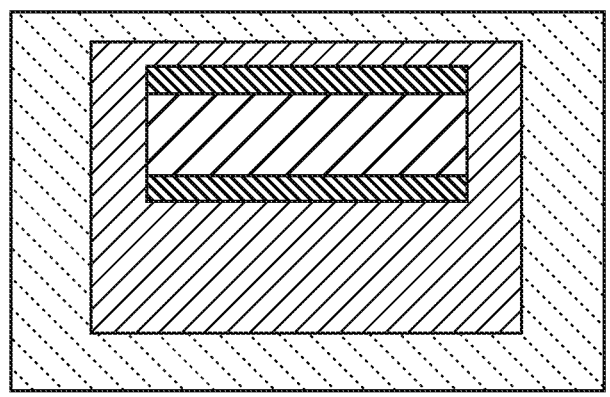

At processing block 330, spacer deposition and patterning of a sidewall sacrificial material is performed. FIG. 4C illustrates one embodiment of the resonator structure after spacer 430 deposition and patterning of a sidewall sacrificial material. At processing block 340, interlayer deposition (ILD) and polishing is performed for planarization. FIG. 4D illustrates one embodiment of the structure after ILD and polishing.

Figure 4E:
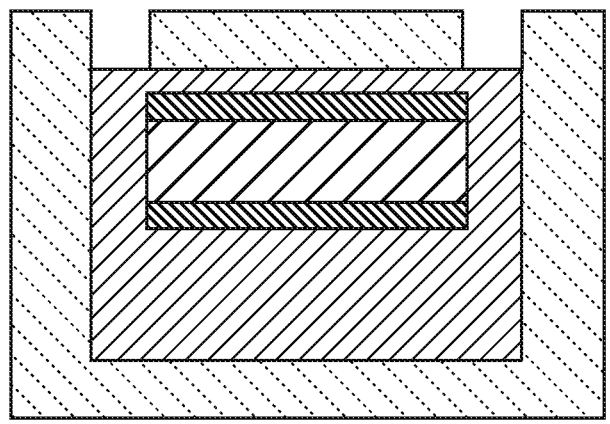
Figure 4F:
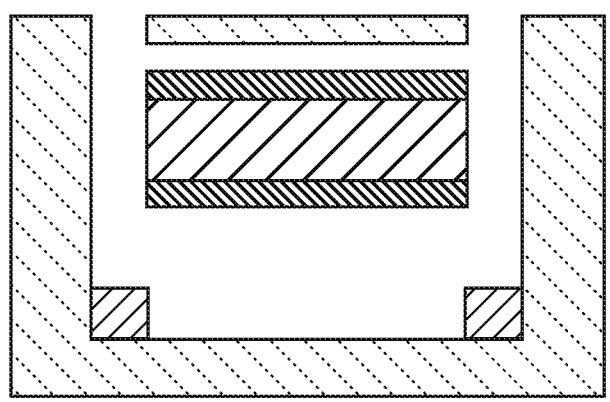

At processing block 350, release holes are patterned through the ILD material. FIG. 4E illustrates one embodiment of the structure after the release holes have been cut. At processing block 360, the sacrificial material is removed. In one embodiment, the sacrificial material is removed via an isotropic (dry or wet) etch. For example, silicon can be removed by xenon di-fluoride selective to other materials; silicon dioxide can be removed using hydrogen fluoride (HF) liquid or vapor selective to other materials; and TiN may be removed using peroxide chemistries selective to other materials. FIG. 4F illustrates one embodiment of the structure after the sacrificial material has been removed.

At processing block 370, a plug material is deposited to seal the release holes (or openings in the air gaps). As discussed above, the deposition is a non-conformal deposition applied via a CVD or PVD type deposition. For instance, the deposition may be a plasma-enhanced chemical vapor deposition (PECVD) silicon dioxide, silicon nitride, or silicon carbide deposition; or a PVD silicon or TiN deposition. The resulting structure is resonator structure 200 disclosed in FIG. 2.

The above described process results in a hermetically sealed resonator structure with reliable performance over lifetime. Further, the sealing of the resonator structure enables down-stream processing and fabrication compatibility. Although discussed with reference to a resonator structure, other embodiments may be implemented from microelectromechanical systems (MEMS) materials that require a mechanical isolation via air gap cavity and a necessity to seal such a device.

Figure 5:
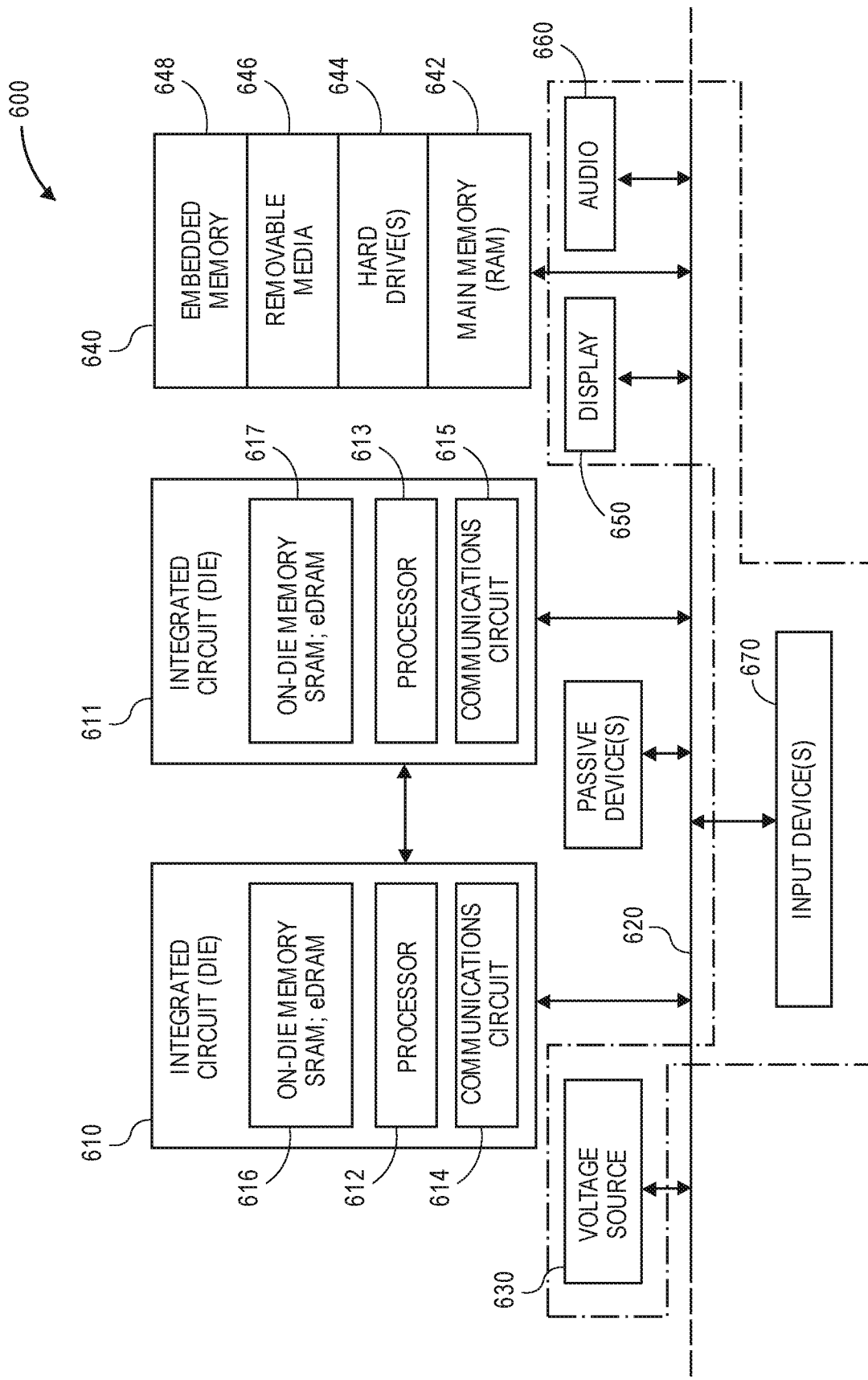
FIG. 5 illustrates a system in which a resonator structure may be implemented.

FIG. 5 illustrates one embodiment of a computer system 600 in which a resonator structure may be implemented. The computer system 600 (also referred to as the electronic system 600) as depicted can embody a semiconductor die packaged with one or more ACIs having metal-density layer units of fractal geometry according to any of the several disclosed embodiments and their equivalents as set forth in this disclosure. The computer system 600 may be a mobile device such as a netbook computer. The computer system 600 may be a mobile device such as a wireless smart phone. The computer system 600 may be a desktop computer. The computer system 600 may be a hand-held reader. The computer system 600 may be a server system. The computer system 600 may be a supercomputer or high-performance computing system.

In an embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

The integrated circuit 610 is electrically coupled to the system bus 620 and includes any circuit, or combination of circuits according to an embodiment. In an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor. In an embodiment, the processor 612 includes a semiconductor die packaged with one or more ACIs having metal-density layer units of fractal geometry, as disclosed herein. In an embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems, or a communications circuit for servers. In an embodiment, the integrated circuit 610 includes on-die memory 616 such as static random-access memory (SRAM). In an embodiment, the integrated circuit 610 includes embedded on-die memory 616 such as embedded dynamic random-access memory (eDRAM).

In an embodiment, the integrated circuit 610 is complemented with a subsequent integrated circuit 611. Useful embodiments include a dual processor 613 and a dual communications circuit 615 and dual on-die memory 617 such as SRAM. In an embodiment, the dual integrated circuit 610 includes embedded on-die memory 617 such as eDRAM.

In an embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648 such as the first die in an embedded TSV die stack, according to an embodiment.

In an embodiment, the electronic system 600 also includes a display device 650, an audio output 660. In an embodiment, the electronic system 600 includes an input device such as a controller 670 that may be a keyboard, mouse, trackball, game controller, microphone, voice-recognition device, or any other input device that inputs information into the electronic system 600. In an embodiment, an input device 670 is a camera. In an embodiment, an input device 670 is a digital sound recorder. In an embodiment, an input device 670 is a camera and a digital sound recorder.

As shown herein, the integrated circuit 610 can be implemented in a number of different embodiments, including a semiconductor die packaged with one or more ACIs having metal-density layer units of fractal geometry according to any of the several disclosed embodiments and their equivalents, an electronic system, a computer system, one or more methods of fabricating an integrated circuit, and one or more methods of fabricating an electronic assembly that includes a semiconductor die packaged with one or more ACIs having metal-density layer units of fractal geometry according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor die packaged with one or more ACIs having metal-density layer units of fractal geometry embodiments and their equivalents. A foundation substrate may be included, as represented by the dashed line of FIG. 5. Passive devices may also be included, as is also depicted in FIG. 5.

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The following clauses and/or examples pertain to further embodiments or examples. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to performs acts of the method, or of an apparatus or system for facilitating hybrid communication according to embodiments and examples described herein.

Some embodiments pertain to Example 1 that includes a method comprising fabricating a resonator structure including depositing a non-conformal thin-film to the resonator structure to seal air gap cavities in the resonator structure.

Example 2 includes the subject matter of Example 1, wherein fabricating the resonator structure further comprises patterning a sacrificial material and patterning the resonator structure.

Example 3 includes the subject matter of Examples 1 and 2, wherein patterning the resonator structure comprises patterning a bottom electrode on the sacrificial material, depositing a piezoelectric material on the bottom electrode, patterning a top electrode on the piezoelectric material and patterning a top sacrificial material.

Example 4 includes the subject matter of Examples 1-3, wherein fabricating the resonator structure further comprises depositing a spacer and patterning a sidewall sacrificial material.

Example 5 includes the subject matter of Examples 1-4, wherein fabricating the resonator structure further comprises depositing an interlayer dialectic layer (ILD) and polishing the ILD.

Example 6 includes the subject matter of Examples 1-5, wherein fabricating the resonator structure further comprises patterning release holes through the ILD to form the air gaps.

Example 7 includes the subject matter of Examples 1-6, wherein fabricating the resonator structure further comprises removing the sacrificial material and depositing the non-conformal thin-film.

Example 8 includes the subject matter of Examples 1-7, wherein depositing the non-conformal thin-film comprises depositing a plug material to fill openings in the air gaps.

Example 9 includes the subject matter of Examples 1-8, wherein the depositing of the non-conformal thin-film is applied via Chemical Vapor Deposition (CVD).

Example 10 includes the subject matter of Examples 1-9, wherein the depositing of the non-conformal thin-film is applied via Physical Vapor Deposition (PVD).

Some embodiments pertain to Example 11 that includes an integrated circuit (IC) comprising a resonator structure, including a resonator and a non-conformal thin-film deposited over the resonator to seal the air gap cavities in the resonator structure.

Example 12 includes the subject matter of Example 11, wherein the resonator comprises a bottom electrode patterned over sacrificial material, a piezoelectric material deposited on the bottom electrode and a top electrode patterned on the piezoelectric material.

Example 13 includes the subject matter of Examples 11 and 12, wherein the resonator structure further comprises a bulk material, a sacrificial material deposited over the bulk material and the resonator patterned over the sacrificial material.

Example 14 includes the subject matter of Examples 11-13, wherein the resonator structure further comprises an interlayer dielectric layer (ILD) patterned over the resonator, release holes patterned through the ILD to form air gaps and a non-conformal thin-film deposited over the ILD to seal the air gap cavities in the resonator structure.

Example 15 includes the subject matter of Examples 11-14, wherein the non-conformal thin-film is applied via Chemical Vapor Deposition (CVD).

Example 16 includes the subject matter of Examples 11-15, wherein the non-conformal thin-film is applied via Physical Vapor Deposition (PVD).

Some embodiments pertain to Example 17 that includes a resonator structure, comprising a resonator and a non-conformal thin-film deposited over the resonator to seal the air gap cavities in the resonator structure.

Example 18 includes the subject matter of Example 17, further comprising a bottom electrode patterned over sacrificial material, a piezoelectric material deposited on the bottom electrode and a top electrode patterned on the piezoelectric material.

Example 19 includes the subject matter of Examples 17 and 18, further comprising a bulk material, a sacrificial material deposited over the bulk material and the resonator patterned over the sacrificial material.

Example 20 includes the subject matter of Examples 17-19, further comprising an interlayer dielectric layer (ILD) patterned over the resonator, release holes patterned through the ILD to form air gaps and a non-conformal thin-film deposited over the ILD to seal the air gap cavities in the resonator structure.

Although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A method comprising;
   fabricating a resonator structure comprising a resonator and a first air gap cavity and a second air gap cavity, the first air gap cavity vertically over a location adjacent to a first side of the resonator, and the second air gap cavity vertically over a location adjacent to a second side of the resonator, the second side opposite the first side; and
   depositing a non-conformal thin-film over the resonator structure to seal the first air gap cavity and the second air gap cavity in the resonator structure.

2. The method of claim 1, wherein patterning the resonator structure comprises:
   patterning a bottom electrode on the sacrificial material;
   depositing a piezoelectric material on the bottom electrode;
   patterning a top electrode on the piezoelectric material; and
   patterning a top sacrificial material.

3. The method of claim 1, wherein fabricating the resonator structure further comprises:
   patterning a sacrificial material; and
   patterning the resonator structure.

4. The method of claim 3, wherein fabricating the resonator structure further comprises:
   depositing a spacer; and
   patterning a sidewall sacrificial material.

5. The method of claim 4, wherein fabricating the resonator structure further comprises:
depositing an interlayer dielectric layer (ILD); and
polishing the ILD.

6. The method of claim 5, wherein fabricating the resonator structure further comprises patterning release holes through the ILD to form the first air gap cavity and the second air gap cavity.

7. The method of claim 6, wherein fabricating the resonator structure further comprises:
removing the sacrificial material; and
depositing the non-conformal thin-film.

8. The method of claim 7, wherein depositing the non-conformal thin-film comprises depositing a plug material to fill the first air gap cavity and the second air gap cavity.

9. The method of claim 8, wherein the depositing of the non-conformal thin-film is applied via Chemical Vapor Deposition (CVD).

10. The method of claim 8, wherein the depositing of the non-conformal thin-film is applied via Physical Vapor Deposition (PVD).

11. An integrated circuit (IC) comprising a resonator structure, the resonator structure including:
a resonator having a first side and a second side, the second side opposite the first side;
a first air gap cavity vertically over a location adjacent to the first side of the resonator;
a second air gap cavity vertically over a location adjacent to the second side of the resonator; and
a non-conformal thin-film sealing the first air gap cavity and the second air gap cavity.

12. The IC of claim 11, wherein the resonator comprises:
a bottom electrode patterned over sacrificial material;
a piezoelectric material deposited on the bottom electrode; and
a top electrode patterned on the piezoelectric material.

13. The IC of claim 12, wherein the resonator structure further comprises:
a bulk material;
a sacrificial material deposited over the bulk material; and
the resonator patterned over the sacrificial material.

14. The IC of claim 13, wherein the resonator structure further comprises:
an interlayer dielectric layer (ILD) patterned over the resonator;
a release hole patterned through the ILD to form the first air gap cavity and the second air gap cavity; and
the non-conformal thin-film deposited over the ILD to seal the first air gap cavity and the second air gap cavity of the resonator structure.

15. The IC of claim 14, wherein the non-conformal thin-film is applied via Chemical Vapor Deposition (CVD).

16. The IC of claim 14, wherein the non-conformal thin-film is applied via Physical Vapor Deposition (PVD).

17. A resonator structure, comprising:
a resonator having a first side and a second side, the second side opposite the first side;
a first air gap cavity vertically over a location adjacent to the first side of the resonator;
a second air gap cavity vertically over a location adjacent to the second side of the resonator; and
a non-conformal thin-film sealing the first air gap cavity and the second air gap cavity.

18. The resonator structure of claim 17, wherein the resonator comprises:
a bottom electrode;
a piezoelectric material deposited on the bottom electrode; and
a top electrode patterned on the piezoelectric material.

19. The resonator structure of claim 18, further comprising:
a bulk material;
a sacrificial material deposited over the bulk material; and
the resonator patterned over the sacrificial material.

20. The resonator structure of claim 19, further comprising:
an interlayer dielectric layer (ILD) patterned over the resonator;
a release hole patterned through the ILD to form the first air gap cavity and the second air gap cavity; and
the non-conformal thin-film deposited over the ILD to seal the first air gap cavity and the second air gap cavity of the resonator structure.

* * * * *